(12) United States Patent
Lawton et al.

(10) Patent No.: US 8,062,746 B2
(45) Date of Patent: *Nov. 22, 2011

(54) RESIN COMPATIBLE YARN BINDER AND USES THEREOF

(75) Inventors: Ernest L. Lawton, Clemmons, NC (US); Robert Rau, Greensboro, NC (US)

(73) Assignee: PPG Industries, Inc., Pittsburgh, PA (US)

( * ) Notice: Subject to any disclaimer, the term of this patent is extended or adjusted under 35 U.S.C. 154(b) by 223 days.

This patent is subject to a terminal disclaimer.

(21) Appl. No.: 10/383,523

(22) Filed: Mar. 10, 2003

(65) Prior Publication Data

US 2004/0180202 A1 Sep. 16, 2004

(51) Int. Cl.
*D02G 3/00* (2006.01)
*B32B 9/00* (2006.01)

(52) U.S. Cl. ......... 428/378; 428/372; 428/391; 428/392

(58) Field of Classification Search .................. 428/372, 428/375, 378, 392, 391
See application file for complete search history.

(56) References Cited

U.S. PATENT DOCUMENTS

| | | |
|---|---|---|
| 2,723,215 A | 11/1955 | Biefeld et al. |
| 2,740,239 A | 4/1956 | Ball et al. |
| 2,793,478 A | 5/1957 | Rohowetz |
| 2,797,469 A | 7/1957 | Kahn |
| 3,146,560 A | 9/1964 | Hurst |
| 3,312,569 A | 4/1967 | Philipps et al. |
| 3,556,448 A | 1/1971 | Dobbs |
| 3,586,063 A | 6/1971 | Bell, Jr. et al. |
| 3,664,855 A | 5/1972 | Morrison et al. |
| 3,688,453 A | 9/1972 | Legacy et al. |
| 3,700,538 A | 10/1972 | Kennedy |
| 3,709,721 A | 1/1973 | King |
| 3,919,028 A | 11/1975 | Lewis et al. |
| 3,928,666 A | 12/1975 | Morrison et al. |
| 4,009,317 A | 2/1977 | Chase et al. |
| 4,118,528 A | 10/1978 | Lowry |
| 4,168,345 A | 9/1979 | de Massey et al. |
| 4,228,514 A | 10/1980 | Weiss |
| 4,247,364 A | 1/1981 | Culp |
| 4,370,157 A | 1/1983 | Barch et al. |
| 4,372,347 A | 2/1983 | Olson |
| 4,379,798 A | 4/1983 | Palmer et al. |
| 4,383,785 A | 5/1983 | Rice |
| 4,390,647 A | 6/1983 | Girgis |
| 4,396,676 A | 8/1983 | Brannon et al. |
| 4,514,466 A | 4/1985 | Leon, Jr. et al. |
| 4,530,876 A | 7/1985 | Brodmann et al. |
| 4,532,176 A | 7/1985 | Briggs et al. |
| 4,579,772 A | 4/1986 | Bhatt et al. |
| 4,605,588 A | 8/1986 | Simpson et al. |
| 4,615,933 A | 10/1986 | Traut |
| 4,642,271 A | 2/1987 | Rice |
| 4,643,936 A | 2/1987 | Eidal |
| 4,713,285 A | 12/1987 | Klein |
| 4,750,806 A | 6/1988 | Biswas et al. |
| 4,752,527 A | 6/1988 | Sanzero et al. |
| 4,762,750 A | 8/1988 | Girgis et al. |
| 4,762,751 A | 8/1988 | Girgis et al. |
| 4,781,495 A | 11/1988 | Hatch et al. |
| 4,789,593 A | 12/1988 | Das |
| 4,795,678 A | 1/1989 | Girgis |
| 4,806,416 A | 2/1989 | Puzo |
| 4,810,576 A | 3/1989 | Gaa et al. |
| 4,820,575 A | 4/1989 | Kölzer |
| 4,826,365 A | 5/1989 | White |
| 4,858,479 A | 8/1989 | Voss et al. |

(Continued)

FOREIGN PATENT DOCUMENTS

CH 670105 5/1989

(Continued)

OTHER PUBLICATIONS

ASTM Designation C-177-85, "Standard Test Method for Steady-State Heat Flux Measurements and Thermal Transmission Properties by Means of the Guarded-Hot-Plate Apparatus," (Reapproved 1993), pp. 1-12.
ASTM Designation D 737-96, "Standard Test Method for Air Permeability of Textile Fabrics," (1996), pp. 1-5.
ASTM Designation D-2344-84, "Standard Test Method for Apparent Interlaminar Shear Strength of Parallel Fiber Composites by Short-Beam Method," (Reapproved 1995), pp. 1-3.
ASTM Designation: C-518-91, "Standard Test Method for Steady-State Heat Flux Measurements and Thermal Transmission Properties by Means of the Heat Flow Meter Apparatus," (1991), pp. 1-12.
Boron Nitride Lubicoat®-BNW, "Non-Corrosive, Neutral pH Past Version of the Boron Nitride Lubricoat®," a technical bulletin of ZYP Coatings.
Boron Nitride Lubicoat®, "Inert, Non-Reactive, High Temperature Protection, Lubrication and Release," a technical bulletin of ZYP Coatings.

(Continued)

*Primary Examiner* — Jill Gray

(74) *Attorney, Agent, or Firm* — Finnegan Henderson Farabow Garrett & Dunner, LLP

(57) ABSTRACT

A fiber strand comprising at least one fiber at least partially coated with a composition formed from at least one rosin, at least one cationic lubricant, at least one film forming material, at least one organosilane coupling agent, and at least one dispersion of polymeric particles. A fiber strand comprising at least one fiber at least partially coated with a composition formed from components comprising at least one rosin, at least one polymeric lubricant, at least one film forming material, at least one organosilane coupling agent, and at least one dispersion of polymeric particles. A fiber strand comprising at least one fiber at least partially coated with a starch-free composition comprising at least one rosin, at least one cationic lubricant, at least one film forming material, and at least one organosilane coupling agent. A fiber strand comprising at least one fiber at least partially coated with a starch-free composition comprising at least one rosin, at least one polymeric lubricant, at least one film forming material, and at least one organosilane coupling agent. A fiber strand comprising at least one fiber at least partially coated with a composition comprising at least one rosin, at least one silyated polyamine, at least one film forming material, and at least one organosilane coupling agent. Also provided are fabrics and composite materials comprising at least one of these fiber strands.

49 Claims, No Drawings

U.S. PATENT DOCUMENTS

| | | | |
|---|---|---|---|
| 4,863,787 A | 9/1989 | Gawin | |
| 4,869,954 A | 9/1989 | Squitieri | |
| 4,872,787 A | 10/1989 | Arai et al. | |
| 4,894,105 A | 1/1990 | Dyksterhouse et al. | |
| 4,913,740 A | 4/1990 | Frederickson | |
| 4,917,547 A | 4/1990 | Frederickson et al. | |
| 4,919,866 A | 4/1990 | Kubbutat | |
| 4,929,370 A | 5/1990 | Hatch et al. | |
| 4,935,294 A | 6/1990 | Misevich et al. | |
| 4,943,606 A | 7/1990 | Inoue et al. | |
| 4,948,662 A | 8/1990 | Simpson et al. | |
| 4,960,634 A | 10/1990 | Boyko et al. | |
| 4,971,779 A | 11/1990 | Paine et al. | |
| 4,980,217 A | 12/1990 | Grundfest et al. | |
| 4,997,702 A | 3/1991 | Gazit et al. | |
| 5,005,978 A | 4/1991 | Skunes et al. | |
| 5,011,870 A | 4/1991 | Peterson | |
| 5,025,045 A | 6/1991 | Gawin et al. | |
| 5,028,984 A | 7/1991 | Ameen et al. | |
| 5,038,555 A | 8/1991 | Wu et al. | |
| 5,047,279 A | 9/1991 | Nasu et al. | |
| 5,047,281 A | 9/1991 | Betz et al. | |
| 5,067,859 A | 11/1991 | Korbonski | |
| 5,082,402 A | 1/1992 | Gaku et al. | |
| 5,126,532 A | 6/1992 | Inagawa et al. | |
| 5,132,254 A | 7/1992 | Stempin et al. | |
| 5,151,146 A | 9/1992 | Green | |
| 5,165,932 A | 11/1992 | Horvath | |
| 5,188,757 A | 2/1993 | Paine, Jr. et al. | |
| 5,204,295 A | 4/1993 | Paine, Jr. et al. | |
| 5,206,078 A | 4/1993 | Inoguchi et al. | |
| 5,217,796 A | 6/1993 | Kasai et al. | |
| 5,219,656 A | 6/1993 | Klett et al. | |
| 5,230,951 A | 7/1993 | Birchall et al. | |
| 5,246,746 A | 9/1993 | Michalske et al. | |
| 5,275,883 A | 1/1994 | Leone et al. | |
| 5,281,441 A | 1/1994 | Kasai et al. | |
| 5,284,807 A | 2/1994 | Komori et al. | |
| 5,286,562 A | 2/1994 | Girgis | |
| 5,324,766 A | 6/1994 | Ikejiri et al. | |
| 5,326,410 A | 7/1994 | Boyles | |
| 5,336,024 A | 8/1994 | Nakagawa et al. | |
| 5,354,602 A | 10/1994 | Stranford et al. | |
| 5,358,741 A | 10/1994 | Gat | |
| 5,364,685 A | 11/1994 | Throne | |
| 5,370,911 A | 12/1994 | Throne et al. | |
| 5,412,003 A | 5/1995 | Akiyama et al. | |
| 5,418,194 A | 5/1995 | Dawes et al. | |
| 5,427,986 A | 6/1995 | Chyung et al. | |
| 5,431,995 A | 7/1995 | Narita et al. | |
| 5,435,671 A | 7/1995 | Weinreich | |
| 5,449,480 A | 9/1995 | Kuriya et al. | |
| 5,507,603 A | 4/1996 | Nakano et al. | |
| 5,507,962 A | 4/1996 | Jahanmir et al. | |
| 5,508,096 A | 4/1996 | Van Skyhawk | |
| 5,520,999 A | 5/1996 | Van Skyhawk et al. | |
| 5,541,238 A | 7/1996 | Yamada et al. | |
| 5,552,215 A | 9/1996 | Tredway et al. | |
| 5,562,966 A | 10/1996 | Clarke et al. | |
| 5,591,789 A | 1/1997 | Iruvanti et al. | |
| 5,593,767 A | 1/1997 | Noda et al. | |
| 5,599,144 A | 2/1997 | Bickham et al. | |
| 5,672,297 A | 9/1997 | Soane | |
| 5,674,351 A | 10/1997 | Lovoi | |
| 5,677,045 A | 10/1997 | Nagai et al. | |
| 5,690,715 A | 11/1997 | Schiwek | |
| 5,690,837 A | 11/1997 | Nakaso et al. | |
| 5,719,090 A | 2/1998 | Appelt et al. | |
| 5,759,924 A | 6/1998 | Sahlin | |
| 5,773,146 A | 6/1998 | Lawton et al. | |
| 5,800,874 A | 9/1998 | Appelt et al. | |
| 5,853,809 A | 12/1998 | Campbell et al. | |
| 5,858,461 A | 1/1999 | Appelt et al. | |
| 5,866,253 A | 2/1999 | Philipps et al. | |
| 5,869,173 A | 2/1999 | Zheng et al. | |
| 5,871,819 A | 2/1999 | Appelt et al. | |
| 5,874,009 A | 2/1999 | Inada et al. | |
| 5,877,240 A | 3/1999 | Piret et al. | |
| 5,888,036 A | 3/1999 | Arai et al. | |
| 5,888,627 A | 3/1999 | Nakatani | |
| 5,907,106 A | 5/1999 | Segar | |
| 5,910,255 A | 6/1999 | Noddin | |
| 5,935,452 A | 8/1999 | Inada et al. | |
| 5,940,787 A | 8/1999 | Gelston | |
| 5,984,523 A | 11/1999 | Houser et al. | |
| 5,998,237 A | 12/1999 | Conrod et al. | |
| 6,000,886 A | 12/1999 | Washio et al. | |
| 6,060,150 A | 5/2000 | Nakatani et al. | |
| 6,117,516 A | 9/2000 | Nakata | |
| 6,124,220 A | 9/2000 | Nakata et al. | |
| 6,419,981 B1 * | 7/2002 | Novich et al. | 427/180 |
| 6,593,255 B1 * | 7/2003 | Lawton et al. | 442/59 |
| 6,809,046 B2 * | 10/2004 | Velpari et al. | 442/187 |
| 2002/0051882 A1 * | 5/2002 | Lawton et al. | 428/378 |
| 2002/0055313 A1 * | 5/2002 | Velpari et al. | 442/180 |
| 2002/0058449 A1 * | 5/2002 | Velpari et al. | 442/59 |
| 2002/0086598 A1 * | 7/2002 | Velpari et al. | 442/74 |
| 2002/0193027 A1 * | 12/2002 | Dana et al. | 442/285 |
| 2006/0078721 A1 * | 4/2006 | Rau et al. | 428/298.7 |

FOREIGN PATENT DOCUMENTS

| | | |
|---|---|---|
| DE | 19-605801 | 8/1997 |
| EP | 0468476 | 1/1992 |
| EP | 588244 | 6/1994 |
| EP | 1 457 466 A2 | 9/2004 |
| FR | 2-503766 | 10/1982 |
| GB | 2-236540 | 4/1991 |
| JP | 53-143582 | 12/1978 |
| JP | 54 106627 A | 8/1979 |
| JP | 80-030315 | 8/1980 |
| JP | 57-045054 | 3/1982 |
| JP | 59-047479 | 3/1984 |
| JP | 60-209072 | 10/1985 |
| JP | 61-213115 | 9/1986 |
| JP | 87-026906 | 6/1987 |
| JP | 63-270106 | 11/1988 |
| JP | 1-202442 | 8/1989 |
| JP | 1-203247 | 8/1989 |
| JP | 1-222950 | 9/1989 |
| JP | 1-249333 | 10/1989 |
| JP | 2-251651 | 10/1990 |
| JP | 3-115332 | 5/1991 |
| JP | 3-212987 | 9/1991 |
| JP | 3-214685 | 9/1991 |
| JP | 91-060862 | 9/1991 |
| JP | 4-002857 | 1/1992 |
| JP | 4-055437 | 2/1992 |
| JP | 4-125140 | 4/1992 |
| JP | 4-255288 | 9/1992 |
| JP | 04-276694 | 10/1992 |
| JP | 4-366628 | 12/1992 |
| JP | 4-367763 | 12/1992 |
| JP | 5-000493 | 1/1993 |
| JP | 5-078945 | 3/1993 |
| JP | 5-110218 | 4/1993 |
| JP | 5-174623 | 7/1993 |
| JP | 93-064586 | 9/1993 |
| JP | 5-261855 | 10/1993 |
| JP | 5-286093 | 11/1993 |
| JP | 6-248572 | 9/1994 |
| JP | 6-305078 | 11/1994 |
| JP | 7-022718 | 1/1995 |
| JP | 7-069683 | 3/1995 |
| JP | 7-102483 | 4/1995 |
| JP | 7-176843 | 7/1995 |
| JP | 7-279055 | 10/1995 |
| JP | 8-012380 | 1/1996 |
| JP | 8-118542 | 5/1996 |
| JP | 8-119682 | 5/1996 |
| JP | 8-309928 | 11/1996 |
| JP | 8-325950 | 12/1996 |
| JP | 4-307787 | 1/1997 |
| JP | 9-003217 | 1/1997 |
| JP | 9-003770 | 1/1997 |
| JP | 9-087992 | 3/1997 |
| JP | 97-150965 | 6/1997 |
| JP | 9-208268 | 8/1997 |

| | | |
|---|---|---|
| JP | 9-209233 | 8/1997 |
| JP | 2-659490 | 9/1997 |
| JP | 9-241397 | 9/1997 |
| JP | 9-255374 | 9/1997 |
| JP | 9-268034 | 10/1997 |
| JP | 9-270584 | 10/1997 |
| JP | 9-308809 | 12/1997 |
| JP | 2-740600 | 4/1998 |
| JP | 10-146916 | 6/1998 |
| JP | 2-787846 | 8/1998 |
| JP | 10-338758 | 12/1998 |
| JP | 11-269752 | 10/1999 |
| JP | 11-286073 | 10/1999 |
| JP | 3-125093 | 1/2001 |
| JP | 3-151397 | 4/2001 |
| SU | 859400 | 8/1981 |
| SU | 2-072121 | 7/1991 |
| WO | WO 90/01860 | 2/1990 |
| WO | WO 97/14280 | 4/1997 |
| WO | WO 97/35457 | 9/1997 |
| WO | WO 01/68748 A | 9/2001 |

OTHER PUBLICATIONS

Weld Spatter Release, "Provides Teflon®-Like Release to Weld Spatter," a technical bulletin of ZYP Coatings.

Boron Nitride Releasecoat-Conc, "Allows for Maximum Dilution for Maximum Economy," a technical bulletin of ORPAC.

Braze Stop-Off Paint, "Provides Teflon®-Like Release with Braze Alloys," a technical bulletin of ZYP Coatings.

Brennan, John J., "Interfaces in BN Coated Fiber Reinforced Glass-Ceramic Matrix Composites," Scripta Metallurgica et Materialia, vol. 31, No. 8, (1994), pp. 959-964.

Callister, William D., Jr., "Materials Science and Engineering, An Introduction," (John Wiley & Sons, Inc., $2^{nd}$ Ed., 1991), pp. 637, 662.

Campbell, W. E., "Solid Lubricants," (Chapter 10), Boundary Lubrication: An Appraisal of World Literature, ASME Research Comm. on Lubrication, (1969), pp. 197-203.

Campbell, S. S. & Gonczy, S. T., "In-Situ Formation of Boron Nitride Interfaces on Nextel 312™ Continuous Ceramic Fiber I: Nitriding Process and BlackGlas™ Ceramic Matrix Composite Properties," pp. 327-336, 1998.

Novich, Bruce E. "Hybon RCY Yarns—A Laminate Reinforcement Developed for Printed Circuit Boards," CircuiTree, pp. 2-4 (1999).

Clauss, Francis J., Solid Lubricants and Self-Lubricating Solids, (Academic Press, 1972), pp. 1, 19-22, 42-54, 75-77, 80-82, 90-102, 113-120, 128.

"The conversion of glass into glass fibre," pp. 115-122, 126-135.

Henningsen, Charles G. & Gause, Smith A., "Base Materials," (Chapter 6), Printed Circuits Handbook, (McGraw-Hill $3^{rd}$ Ed.), pp. 6.1-6.14, 1988.

Cranmer, David C., "Fiber Coating and Characterization," Ceramic Bulletin, vol. 68, No. 2 (1989) pp. 415-419.

Fanning & Keramidas, "II. Structural Properties and Mineral Identification," Minerals in Soil Environments, (Soil Science Soc'y of Am. 1977), pp. 196-200.

Fanning & Keramidas, "III. Weathering and Synthesis Relationships," Minerals in Soil Environments, (Soil Science Soc'y of Am. 1977), pp. 221-232.

Einset, Erik O., et al. "Processing Conditions for Boron Nitride Coatings in Fiber Bundles via Chemical Vapor Deposition," J. Am. Ceram. Soc'y, vol. 77, No. 12, (1994), pp. 3081-3086.

Encyclopedia of Polymer Science and Technology, vol. 6 (1967) pp. 505-712.

Evans, R. C., An Introduction to Crystal Chemistry, (Cambridge 1948), pp. 274-276.

Fabrics Around the World, technical bulletin of Clark-Schwebel, Inc., (1995), pp. 4-52.

Fernando, J. A., et al. "Effect of boron nitride coating on the tensile strength of Nextel 480™ fiber," Material Science and Eng'g, A154, (1992), pp. 103-108.

Ferrigno, Thomas, H., "Principes of Filler Selection and Use," Handbook of Fillers and Plastics, (Katz, H., et al. 1997), pp. 8-10, 28.

Loewenstein, K. L., "Fibre Sizes for Continuous Glass Fibres," The Manufacturing Technology of Continuous Glass Fibres, $3^{rd}$ ed., 1993, pp. 237-291.

Hailing, J., "Types of Solid Lubricant," (6.4), Principles of Tribology, (1975), pp. 134-139.

Hillel, Daniel, "Nature and Behavior of Clay," (Chapter 5), Fundamentals of Soil Physics (Academic Press, 1980) pp. 71-75.

Hlavac, Jan, "Glass-Ceramics," (Part III), "Technology of Ceramics," (Part IV), The Technology of Glass and Ceramics: An Introduction, (Elsevier Scientific Pub. Co., 1983), pp. 232, 278.

Hunt, John M., Petroleum Geochemistry and Geology, (W. H. Freeman & Co. 1979) p. 551.

Webster's Third New International Dictionary of the English Language Unabridged, (G. & C. Merriam Co., 1971), pp. 2169.

IPC-4101, "Specification for Base Materials for Rigid and Multilayer Printed Boards," (Dec. 1997).

IPC-EG-140, "Specification for Finished Fabric Woven from "E" Glass for Printed Boards," (Jun. 1997).

IPC-TM-650, "Test Methods Manual, Flexural Strength of Laminates (at Ambient Temperature)," (Dec. 1994).

Katz, Harry S. & Milewski, John V. (Eds.), Handbook of Fillers for Plastics, (Van Nostrand Reinhold Co., 1987), pp. 65-115.

Kirk-Othmer, "Manganese Compound to Nitrophenols," Encyclopedia of Chemical Technology, vol. 13, (John Wiley & Sons, Inc., $2^{nd}$ ed., 1967), pp. 412-413.

Kirk-Othmer, "B to Calcium," Encyclopedia of Chemical Technology, vol. 3, (John Wiley & Sons, Inc., $2^{nd}$ ed., 1964), pp. 678-679.

Kirk-Othmer; "Calcium Compounds to Chloramphenicol," Encyclopedia of Chemical Technology, vol. 4, (John Wiley & Sons, Inc., $2^{nd}$ ed., 1964), pp. 158-162, 203, 217, 304-307, 330-331.

Kirk-Othmer; "Iron to Manganese," Encyclopedia of Chemical Technology, vol. 12, (John Wiley & Sons, Inc., $2^{nd}$ ed., 1967), pp. 588-596.

Komarneni, Sridhar, et al. "Novel function for anionic clays: selective transition metal cation uptake by diodochy," Journal of Material Chemistry, vol. 8, No. 6, (1998), pp. 1329-1331.

Komarneni, Sridhar, et al. "Novel Swelling Mica: Synthesis, Characterization, and Cation Exchange," New Developments in Ion Exchange, (Elsevier Science Publishers, 1991), pp. 51-56.

Lewis, Richard J., Sr., "Hawley's Condensed Chemical Dictionary," ($12^{th}$ Ed. 1993) pp. 141, 164, 305, 331, 435, 461, 609-610, 712, 782-784, 793, 795, 1075, 1113.

Lide, David R. (Ed.), CRC Handbook of Chemistry and Physics, (CRC Press, $71^{st}$ ed., 1990) at pp. 4-154-159, 12-23-24, 12-63, 12-119, 12-124.

Loewenstein, K.L., The Manufacturing Technology of Glass Fibres, (Elsevier, $3^{rd}$ ed., 1993), pp. 25, 27, 47-60.

Loewenstein, K.L., The Manufacturing Technology of Glass Fibres, (Elsevier, $3^{rd}$ ed., 1993), pp. 30-44, 115-122, 126-135, 237-291.

Ludema, Kenneth C., Friction, Wear, Lubrication, A Textbook in Tribology, (CRC Press, 1996), pp. 27, 125, 129.

Mark, James E., et al. "Introduction," (Chapter 1), Inorganic Polymers, (Prentice Hall, 1992), pp. 1-5.

"Materials and Processes Selection," Electronic Materials Handbook, vol. 1 Packaging, (ASM Int'l, 1989), pp. 113-115.

Olson, Larry D., "Resins and Reinforcements," Electronic Materials Handbook, vol. 1 Packaging, (ASM Int'l 1989) pp. 534-537.

Mitchell, James K., "Soil Mineralogy," (Chapter 3), Fundamentals of Soil Behavior, (John Wiley & Sons, Inc., 1976), pp. 32-34.

Ron Dagani, "Hollow nanoparticles excel in lubrication," C&EN (Jun. 23, 1997), pp. 9-10.

Tenne, Reshef, "New Lubricating Material Halves Friction," Inside R&D (Jun. 25, 1997), pp. 1-2.

European Patent Office, "Patent Abstracts of Japan," vol. 14, No. 423, (Sep. 1990) Pub. No. 02160944, Pub. Date Jun. 20, 1990.

Perros, Theodore P., Chemistry, (American Book Co., 1967), pp. 186-187.

Plueddemann, Edwin P., "Performance of Silane Coupling Agents," (Chapter 6), Silane Coupling Agents, (Plenum Press, 1982), pp. 146-147.

PolarTherm® Thermally conducive fillers for polymeric materials, a Technical Bulletin of Advanced Ceramics Corp. of Lakewood, OH (1996).

Shen, Lu, et al. "Characterization of Dip-Coated Boron Nitride on Silicon Carbide Fibers," J. Am. Chem. Soc., vol. 77, No. 4, (Apr. 1994), pp. 1011-1016.

Handbook of Plastic Materials and Technology, (Chapter 79, "Reinforced Plastics, Filament Winding," pp. 955-972), (Chapter 80, "Reinforced Plastics, Thermoset Matched-Die Molding," pp. 973-1038), (Chapter 81, "Reinforced Plastics, Pultrusion," pp. 1039-1062), (Chapter 87, "Extrusion," pp. 1179-1215), (Chapter 89, "Injection Molding (IM)," pp. 1225-1271), 1990.

Singh, Raj N. & Brun, Milivoj K., "Effect of Boron Nitride Coating on Fiber-Matrix Interactions," Advanced Ceramic Materials, (1988), vol. 3, No. 3, pp. 235-237.

Slack, G. A., "Nonmetallic Crystals with High Thermal Conductivity," J. Phys. Chem. Solids, (1973), vol. 34, pp. 321-335.

Subramanian, R V., "Basalt Fibers," (Chapter 15), Handbook of Reinforcements for Plastics, (Van Notrand Reinhold Co., 1987), pp. 287-295.

Sulzer Ruti, L5000 Air Jet Weaving Machine, Product Bulletin.

Sulzer Ruti, L5200 Air-Jet Weaving Machine, Product Bulletin.

Tokumoto, Kei & Tanaka, Akira, "Development of Self-Lubricating Cemented Carbide," Nippon Tungsten Co., vol. 24 (Rev. 1991), pp. 5-12.

Tourne, Joan, "Using New Interconnect Technologies to Reduce Substrate Cost," Proceedings of the European Joint Conference VI: EIPC, (1997).

Tsuji, Masamichi & Komarneni, Sridhar, "An Extended Method for Analytical Evaluation of Distribution Coefficients on Selective Inorganic Ion Exchangers," Separation Science and Technology, (1992), vol. 27, No. 6, pp. 813-821.

Tsuji, Masamichi & Komarneni, Sridhar, "Selective exchange of divalent transition metal ions in cryptomelane-type manganic acid with tunnel structure," J. Mater. Res., (1993), vol. 8, No. 3, 611-616.

Tummalas, R. (Ed.), Microelectronics Packaging Handbook, (Van Nostrand Reinhold, 1989), pp. 25-43, 174, 858-861, 885-909.

van Olphen, H., "Clay Mineralogy," (Chapter 5), Clay Colloid Chemistry: For Clay Technologists, Geologists, and Soil Scientists (John Wiley & Sons, $2^{nd}$ ed., 1977), pp. 57-63.

Wallenberger, Frederick T., et al. "Glossary," Advanced Inorganic Fibers, (Kluwer Academic Publishers, 2000), p. 335.

Weast, Robert C. (Ed), Handbook of Chemistry and Physics, (CRC Press, $56^{th}$ ed., 1975), pp. 12-54, D-171, F-22, F-166.

WebElements, "Mineralogical hardness," visited Feb. 26, 1998.

Webster's New Collegiate Dictionary (1977) at pp. 1178.

Weimer, Alan W. (Ed.), "Electrical and Magnetic Properties at 293 K," Carbide, Nitride and Boride Materials Synthesis and Processing, (Chapman & Hall, 1997), pp. 653-654.

\* cited by examiner

RESIN COMPATIBLE YARN BINDER AND USES THEREOF

This invention relates generally to coated fiber strands for reinforcing composites and, in certain embodiments, to coated fiber strands that are compatible with a matrix material that the strands are incorporated into.

In thermosetting molding operations, good "wet-through" (penetration of a polymeric matrix material through the mat or fabric) and "wet-out" (penetration of a polymeric matrix material through the individual bundles or strands of fibers in the mat or fabric) properties are desirable. In contrast, good dispersion properties (i.e., good distribution properties of fibers within a thermoplastic material) are of predominant concern in typical thermoplastic molding operations.

In the case of composites or laminates formed from fiber strands woven into fabrics, in addition to providing good wet-through and good wet-out properties of the strands, it is desirable that the coating on the surfaces of the fibers strands protect the fibers from abrasion during processing, provide for good weavability, particularly on air-jet looms and be compatible with the polymeric matrix material into which the fiber strands are incorporated. However, many sizing components are not compatible with the polymeric matrix materials and can adversely affect adhesion between the glass fibers and the polymeric matrix material. For example, starch, which is a commonly used sizing component for textile fibers, is generally not compatible with polymeric matrix material. As a result, these incompatible materials must be removed from the fabric prior to impregnation with the polymeric matrix material.

The removal of such non-resin compatible sizing materials, i.e., de-greasing or de-oiling the fabric, can be accomplished through a variety of techniques. The removal of these non-resin compatible sizing materials is most commonly accomplished by exposing the woven fabric to elevated temperatures for extended periods of time to thermally decompose the sizing(s) (commonly referred to as heat-cleaning). A conventional heat-cleaning process involves heating the fabric at 380° C. for 60-80 hours. However, such heat cleaning steps are detrimental to the strength of the glass fibers, are not always completely successful in removing the incompatible materials and can further contaminate the fabric with sizing decomposition products. Other methods of removing sizing materials have been tried, such as water washing and/or chemical removal. However, such methods generally require significant reformulation of the sizing compositions for compatibility with such water washing and/or chemical removal operations and are generally not as effective as heat-cleaning in removing all the incompatible sizing materials.

In addition, since the weaving process can be quite abrasive to the fiber glass yarns, those yarns used as warp yarns are typically subjected to a secondary coating step prior to weaving, commonly referred to as "slashing", to coat the warp yarns with an abrasion resistance coating (commonly referred to as a "slashing size") to help minimize abrasive wear of the glass fibers. The slashing size is generally applied over the primary size that was previously applied to the glass fibers during the fiber forming operation. However, since typical slashing sizes are also not generally compatible with the polymeric matrix materials, they too must be removed from the woven fabric prior to its incorporation into the resin.

Furthermore, to improve adhesion between the de-greased or de-oiled fabric and the polymeric resin, a finishing size, typically a silane coupling agent and water, is applied to the fabric to re-coat the glass fibers in yet another processing step (commonly called "finishing").

Each of these non-value added processing steps: slashing, de-greasing or de-oiling, and finishing, increase fabric production cycle time and cost. Additionally, each generally requires significant investment in capital equipment and labor. Moreover, the added handling of the fabric associated with these processing steps can lead to fabric damage and decreased quality.

Efforts have been directed toward improving the efficiency or effectiveness of some of these processing steps. There nevertheless remains a need for coatings that can accomplish one or more of the following: inhibit abrasion and breakage of glass fibers; be compatible with a wide variety of matrix materials; provide good hydrolytic stability; and provide for good wet-out and wet-through by the matrix material. In addition, it would be particularly advantageous if the coatings were compatible with modern air-jet weaving equipment to increase productivity. Furthermore, it would be advantageous to eliminate the non-value added processing steps in a fabric forming operation while maintaining the fabric quality required for various applications and providing for good laminate properties.

The fiber strands of the present invention have a unique coating that accomplishes at least the following properties: inhibition of abrasion and breakage of the fibers during processing; good wet-through, wet-out and dispersion properties in formation of composites; and good hydrolytic stability (i.e., resistance to migration of water along the fiber/polymeric matrix material interface). As fully defined below, a "strand" comprises a plurality of individual fibers, i.e., at least two fibers. As used herein, "composite" means the combination of the coated fiber strand of the present invention with an additional material, for example, but not limited to, one or more layers of a fabric incorporating the coated fiber strand combined with a polymeric matrix material to form a laminate. Good laminate strength, good thermal stability, low corrosion and reactivity in the presence of high humidity, reactive acids and alkalies and compatibility with a variety of polymeric matrix materials, which can eliminate the need for removing the coating, and in particular heat or pressurized water cleaning, prior to lamination, are other desirable characteristics which can be exhibited by the coated fiber strands of the present invention.

In certain embodiments, the coated fiber strands of the present invention provide good processability in weaving and knitting. Low fuzz and halos (as used herein, "halos" are rings of broken filaments which can form around rotary tension devices), low broken filaments, low strand tension, high fliability and low insertion time are examples of characteristics, individually or in combination, that can be provided by the coated glass fiber strands of the present invention. These characteristics, individually or in combination, can facilitate weaving and knitting and consistently provide a fabric with few surface defects. In addition, coated fiber strands of the present invention can be suitable for use in an air jet weaving process. As used herein, "air jet weaving" means a type of fabric weaving in which the fill yarn (weft) is inserted into the warp shed by a blast of compressed air from one or more air jet nozzles.

In certain embodiments, the coated fiber strands of the present invention have a unique coating that can facilitate thermal conduction along coated surfaces of the fibers. When used as a continuous reinforcement for an electronic circuit board, such coated glass fibers of the present invention can provide a mechanism to promote heat dissipation from a heat source (such as a chip or circuit) along the reinforcement to conduct heat away from the electronic components and thereby inhibit thermal degradation and/or deterioration of the circuit components, glass fibers and polymeric matrix material. The coated glass fibers of the present invention provide a higher thermal conductivity phase than the matrix material, i.e., a preferential path for heat dissipation and distribution, thereby reducing differential thermal expansion and warpage of the electronic circuit board and improving solder joint reliability.

The coated fiber strands of the present invention can also provide necessary strength and electrical insulation components to armature banding tape, which can be useful for holding the component parts of dynamoelectric machine armatures, armature windings and commutators in radial compression. Absence of such compression can lead to unbalance of the rotating member of such components or, in severe instances, rupture of the member itself. Typically, such bandings are formed of fiber strands which are impregnated with a curable bonding resin that assists in locking the individual fibers of the banding tape in fixed position within the bandings when the resin is cured. By eliminating the cleaning step described above, it is possible for the coated glass fibers of the present invention to impart additional strength and electrical insulation over fibers that have been cleaned by such methods.

The coated fiber strands of the present invention can further serve as a structural-enhancing component of composite materials. Composite materials are important structural materials used in aerospace, aviation, and other applications. Suitable applications include protection of aircraft from damage due to being struck by lightning, masking of aircraft against detection by radar, and use of aerospace composites as rocket engine nozzles or as leading surfaces on reentry vehicles. A composite material contains two or more separate phases which retain their distinct properties within the composite. In a typical non-metallic aerospace composite material, high strength or high modulus reinforcements such as glass fibers are embedded in a matrix of a resin material that is much weaker and more ductile than the reinforcement. The matrix bonds together, aligns, and protects the reinforcement.

A significant aspect of composite materials is that designers can tailor the properties of the material to the requirements of each individual piece of structure, so as to minimize weight and maximize performance. The composite properties are determined by the individual properties of the reinforcement and the matrix phases, and by the relative amounts of the reinforcement and the matrix present in the composite material. The properties of each batch of composite material must be known to be certain that they meet the requirements of the designer for a particular application. Thus, by eliminating the heat-cleaning step that can be detrimental to the strength of the glass fibers and that can further contaminate the fabric with sizing products, it is possible to more accurately predict the properties of the resulting composite material.

In certain embodiments, the coated fiber strands of the present invention can also lessen or eliminate the need for incorporating thermally conductive materials in the matrix resin, which improves laminate manufacturing operations and lowers costly matrix material supply tank purging and maintenance.

The coated fiber strands of the present invention can possess high strand openness. As used herein, the term "high strand openness" means that the strand has an enlarged cross-sectional area and that the filaments of the strand are not tightly bound to one another. The high strand openness can facilitate penetration or wet out of matrix materials into the strand bundles.

Composites, and in particular laminates, of the present invention, made from the fiber strands of the present invention, can possess at least one of the following properties: low coefficient of thermal expansion; good flexural strength; good interlaminar bond strength; and good hydrolytic stability, i.e., the resistance to migration of water along the fiber/matrix interface. Additionally, electronic supports and printed circuit boards of the present invention made from the fiber strands in accordance with the present invention can have at least one of the following properties: good drillability; and resistance to metal migration (also referred to as cathodic-anodic filament formation or CAF). See Tummala (Ed.) et al., *Microelectronics Packaging Handbook*, (1989) at pages 896-897 and IPC-TR-476B, "Electrochemical Migration: Electrochemically Induced Failures in Printed Wiring Boards and Assemblies", (1997) which are specifically incorporated by reference herein. Fiber strands in accordance with the present invention with good drillability have at least one of low tool wear during drilling and good locational accuracy of drilled holes.

As described above, typical fabric forming operations involve subjecting fiber glass yarns and fabric made therefrom to several non-value added processing steps, such as slashing, heat-cleaning and finishing. The present invention can provide methods of forming fabrics, laminates, electronic supports, printed circuit boards, armature banding tape, and aerospace composite materials that reduces or eliminates non-value added processing steps from the fabric forming process while providing fabrics having quality suitable for use in the various disclosed applications. Other advantages of certain embodiments of the present invention include reduced production cycle time, elimination of capital equipment, reduced fabric handling and labor costs, good fabric quality and good final product properties.

In one embodiment of the present invention, a fiber strand comprises at least one fiber at least partially coated with a composition formed from at least one rosin, at least one cationic lubricant, at least one film forming material, at least one organosilane coupling agent, and at least one dispersion of polymeric particles.

In another embodiment of the present invention, a fiber strand comprises at least one fiber at least partially coated with a composition formed from at least one rosin, at least one polymeric lubricant, at least one film forming material, at least one organosilane coupling agent, and at least one dispersion of polymeric particles.

In yet another embodiment of the present invention, a fiber strand comprises at least one fiber at least partially coated with a starch-free composition comprising at least one rosin, at least one cationic lubricant, at least one film forming material, and at least one organosilane coupling agent.

In still another embodiment of the present invention, a fiber strand comprises at least one fiber at least partially coated with a starch-free composition comprising at least one rosin, at least one polymeric lubricant, at least one film forming material, and at least one organosilane coupling agent.

In another embodiment of the present invention, a fiber strand comprises at least one fiber at least partially coated with a composition comprising at least one rosin, at least one silyated polyamine, at least one film forming material, and at least one organosilane coupling agent.

In each of the aforementioned individual embodiments, the components that comprise the coating composition of the present invention are different.

For the purposes of this specification, other than in the operating examples, or where otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

A coated fiber strand according to the present invention comprises a plurality of fibers. As used herein, "strand" means a plurality of individual fibers, i.e., at least two fibers, and the strand can comprise fibers made of different fiberizable materials. (The bundle of fibers can also be referred to as "yarn"). The term "fiber" means an individual filament. Although not limiting the present invention, the fibers can have an average nominal fiber diameter ranging from 3 to 35 micrometers. In certain embodiments, the average nominal fiber diameter of the present invention can be, for example, 5 micrometers and greater. For "fine yarn" applications, the average nominal fiber diameter can range from 5 to 7 micrometers.

The fibers can be formed from any type of fiberizable material known to those skilled in the art including fiberizable inorganic materials, fiberizable organic materials and mixtures of any of the foregoing. The inorganic and organic materials can be either man-made or naturally occurring materials. One skilled in the art will appreciate that the fiberizable inorganic and organic materials can also be polymeric materials. As used herein, the term "polymeric material" means a material formed from macromolecules composed of long chains of atoms that are linked together and that can become entangled in solution or in the solid state[1]. As used herein, the term "fiberizable" means a material capable of being formed into a generally continuous filament, fiber, strand or yarn.

[1]James Mark et al. *Inorganic Polymers*, Prentice Hall Polymer Science and Engineering Series, (1992) at page 1 which is hereby incorporated by reference.

In certain embodiments, the fibers can be formed from an inorganic, fiberizable glass material. Fiberizable glass materials useful in the present invention include but are not limited to those prepared from fiberizable glass compositions such as "E-glass", "A-glass", "C-glass", "D-glass", "G-glass", "R-glass", "S-glass", and E-glass derivatives. As used herein, "E-glass derivatives" means glass compositions that include minor amounts of fluorine and/or boron and most preferably are fluorine-free and/or boron-free. Furthermore, as used herein, "minor amounts of fluorine" means less than 0.5 weight percent fluorine, for example less than 0.1 weight percent fluorine, and "minor amounts of boron" means less than 5 weight percent boron, for example less than 2 weight percent boron. Basalt and mineral wool are examples of other fiberizable glass materials useful in the present invention. In certain embodiments, the glass fibers are selected from E-glass or E-glass derivatives. In other embodiments, the glass fibers are selected from G-glass.

The glass fibers of the present invention can be formed in any suitable method known in the art. For example, glass fibers can be formed in a direct-melt fiber forming operation or in an indirect, or marble-melt, fiber forming operation. In a direct-melt fiber forming operation, raw materials are combined, melted and homogenized in a glass melting furnace. The molten glass moves from the furnace to a forehearth and into fiber forming apparatuses where the molten glass is attenuated into continuous glass fibers. In a marble-melt glass forming operation, pieces or marbles of glass having the final desired glass composition are preformed and fed into a bushing where they are melted and attenuated into continuous glass fibers. If a premelter is used, the marbles are fed first into the premelter, melted, and then the melted glass is fed into a fiber forming apparatus where the glass is attenuated to form continuous fibers. In the present invention, the glass fibers are preferably formed by the direct-melt fiber forming operation. For additional information relating to glass compositions and methods of forming the glass fibers, see K. Loewenstein, *The Manufacturing Technology of Continuous Glass Fibres*, (3d Ed. 1993) at pages 30-44, 47-103, and 115-165; U.S. Pat. Nos. 4,542,106 and 5,789,329; and IPC-EG-140 "Specification for Finished Fabric Woven from 'E' Glass for Printed Boards" at page 1, a publication of The Institute for Interconnecting and Packaging Electronic Circuits (June 1997).

Non-limiting examples of suitable non-glass fiberizable inorganic materials include ceramic materials such as silicon carbide, carbon, graphite, mullite, aluminum oxide and piezoelectric ceramic materials. Non-limiting examples of suitable fiberizable organic materials include cotton, cellulose, natural rubber, flax, ramie, hemp, sisal and wool. Non-limiting examples of suitable fiberizable organic polymeric materials include those formed from polyamides (such as nylon and aramids), thermoplastic polyesters (such as polyethylene terephthalate and polybutylene terephthalate), acrylics (such as polyacrylonitriles), polyolefins, polyurethanes and vinyl polymers (such as polyvinyl alcohol). Non-glass fiberizable materials useful in the present invention and methods for preparing and processing such fibers are discussed at length in the *Encyclopedia of Polymer Science and Technology*, Vol. 6 (1967) at pages 505-712.

It is understood that blends or copolymers of any of the above materials and combinations of fibers formed from any of the above materials can be used in the present invention, if desired. Moreover, the term fiber strand encompasses at least two different fibers made from differing fiberizable materials. In certain embodiments, the fiber strands of the present invention contain at least one glass fiber, although they may contain other types of fibers.

The present invention will now be discussed generally in the context of glass fiber strands, although one skilled in the art would understand that the strand can comprise fibers formed from any fiberizable material known in the art as discussed above. Thus, the discussion that follows in terms of glass fibers applies generally to the other fibers discussed above.

In certain embodiments, at least one and possibly all of the fibers of a fiber strand of the present invention have a coating composition, such as a residue of a coating composition, on at least a portion of the at least one surface of the fibers. This coating can serve to protect the fiber surfaces from abrasion during processing and to inhibit fiber breakage.

Table A lists the diameters and number of fibers in a yarn for several typical glass fiber yarn products.

TABLE A

| Yarn type | Fiber Diameter (centimeters) | Number of Fibers in Bundle |
|---|---|---|
| G37 | $9 \times 10^{-4}$ | 800 |
| G50 | $9 \times 10^{-4}$ | 600 |
| G75 | $9 \times 10^{-4}$ | 400 |
| G150 | $9 \times 10^{-4}$ | 200 |
| E225 | $7 \times 10^{-4}$ | 200 |
| D450 | $5.72 \times 10^{-4}$ | 200 |
| D900 | $5.72 \times 10^{-4}$ | 100 |
| DE75 | $6.35 \times 10^{-4}$ | 800 |

The coating compositions of the present invention can be aqueous coating compositions, and in certain embodiments, can be aqueous, resin compatible coating compositions. The coating compositions can contain volatile organic solvents such as alcohol or acetone as needed, but in certain embodiments are free of such solvents. Additionally, the coating compositions of the present invention can be used as primary sizing compositions and/or secondary sizing or coating compositions.

As used herein, the terms "size", "sized" or "sizing" refers to any coating composition applied to the fibers. The terms "primary size" or "primary sizing" refer to a coating composition applied to the fibers immediately after formation of the fibers. The terms "secondary size", "secondary sizing" or "secondary coating" mean coating compositions applied to the fibers after the application of a primary size. The terms "tertiary size", "tertiary sizing" or "tertiary coating" mean coating compositions applied to the fibers after the application of a secondary size. These coatings can be applied to the fiber before the fiber is incorporated into a fabric or it can be applied to the fiber after the fiber is incorporated into a fabric, e.g. by coating the fabric. The terms "size", "sized" and "sizing" additionally refer to a coating composition (also known as a "finishing size") applied to the fibers after at least a portion, and possibly all of a conventional, non-resin compatible sizing composition has been removed by heat or chemical treatment, i.e., the finishing size is applied to bare glass fibers incorporated into a fabric form.

As used herein, the term "resin compatible" means the coating composition applied to the glass fibers is compatible with the matrix material into which the glass fibers will be incorporated such that the coating composition (or selected coating components) achieves at least one of the following properties: does not require removal prior to incorporation into the matrix material (such as by de-greasing or de-oiling); facilitates good wet-out and wet-through of the matrix material during conventional processing; and results in final composite products having desired physical properties and hydrolytic stability.

At least one and possibly all of the fibers of a fiber strand of the present invention have a coating composition, such as a residue of a coating composition, on at least a portion of the surfaces of the fibers.

In one embodiment, the coating composition of the present invention comprises at least one rosin; at least one cationic lubricant; at least one film forming material; at least one coupling agent; and at least one dispersion of polymeric particles.

In another embodiment, the coating composition of the present invention comprises, at least one rosin; at least one polymeric lubricant; at least one film forming material; at least one coupling agent; and at least one dispersion of polymeric particles.

In still another embodiment, the coating composition of the present invention comprises at least one rosin; at least one cationic lubricant; at least one film forming material; at least one coupling agent; at least one dispersion of polymeric particles; and is a starch-free composition.

In another embodiment, the coating composition of the present invention comprises at least one rosin; at least one polymeric lubricant; at least one film forming material; at least one coupling agent; at least one dispersion of particles; and is a starch-free composition.

In yet another embodiment, the coating composition of the present invention comprises at least one rosin; at least one silyated polyamine; at least one film forming material; and at least one coupling agent.

The coating compositions of the present invention can comprise at least one rosin. In one non-limiting embodiment of the present invention, the at least one rosin is selected from natural rosins, chemically-modified rosins, and combinations thereof.

Useful natural rosins include, but are not limited to, gum rosins, wood rosins, tall-oil rosins, and mixtures thereof. Non-limited examples of suitable gum rosins include the residues obtained after the distillation of turpentine oil from the oleoresin tapped from living trees. Useful wood resins contain the residue obtained by extracting pine stumps with naphtha and distilling off the volatile fraction. Non-limiting examples of appropriate tall-oil rosins are the by-products of the fractionation of tall oil.

Useful chemically-modified rosins include rosins that have been chemically altered such that they no longer exhibit the distinct characteristics of natural rosins. In one non-limiting embodiment the chemically-modified rosin includes at least one dimer and at least one decarboxylated resin acid. A non-limiting example of a useful chemically-modified rosin includes DYNAKOLL SI 100, which was purchased from Eka Chemicals AB, Sweden, which is believed to be a mixture of several reaction products formed when wood rosin is reacted with maleic anhydride, polyethylene glycol, and phenyl glycidyl ether. Thus it is believed DYNAKOLL SI 100 comprises, for example, at least one glycidyl ether group, such as two glycidyl ether groups, and at least one polyethylene glycol group.

The rosin can be present in the coating compositions of the present invention in an amount ranging from 45 to 99 weight percent on a total solids basis. In one non-limiting embodiment, the at least one rosin can be present in the coating composition in an amount ranging from 60 to 90 weight percent on a total solids basis. In another non-limiting embodiment, the at least one rosin can be present in the coating composition in an amount ranging from 70 to 85 weight percent on a total solids basis.

The coating compositions of the present invention can further comprise at least one lubricant. In certain embodiments, the coating composition can comprise one or more cationic lubricants. Non-limiting examples of such cationic lubricants include amine salts of fatty acids (which can, for example, comprise a fatty acid moiety having 12 to 22 carbon atoms and/or tertiary amines having alkyl groups of 1 to 22 atoms attached to the nitrogen atom), alkyl imidazoline derivatives (such as can be formed by the reaction of fatty acids with polyalkylene polyamines), acid solubilized fatty acid amides (for example, saturated or unsaturated fatty acid amides having acid groups of 4 to 24 carbon atoms such as stearic amide), acid solubilized polyunsaturated fatty acid amides, condensates of a fatty acid and polyethylene imine and amide substituted polyethylene imines, such as EMERY 6717, a partially amidated polyethylene imine commercially available from Cognis Corporation of Cincinnati, Ohio and ALUBRASPIN 226 which is available from BASF Corp. of Parsippany, N.J.

Non-limiting examples of useful alkyl imidazoline derivatives are CATION X, which is commercially available from Rhone Poulenc/Rhodia of Princeton, N.J., and ALUBRASPIN 261, which was purchased from BASF Corp. of Parsippany, N.J.

In one embodiment of the present invention, the at least one cationic lubricant comprises one or more silylated polyamine polymers. One non-limiting example of such a silyated polyamine lubricant includes ALUBRASPIN 227, which was purchased from BASF Corp. of Parsippany, N.J. and is disclosed, for example, in U.S. Pat. No. 5,354,829.

In certain embodiments of the present invention, the lubricant can comprise one or more polymeric lubricants. Non-limiting examples of polymeric lubricants include lubricants selected from polyamine polymers. In one embodiment of the present invention, the at least one polymeric lubricant comprises one or more silylated polyamine polymers. One non-limiting example of such a silylated polyamine lubricant includes ALUBRASPIN 227, which was purchased from BASF Corp. of Parsippany, N.J. and is disclosed, for example, in U.S. Pat. No. 5,354,829.

In certain embodiments of the present invention, the amount of the at least one cationic lubricant can be no greater than 15 weight percent of the coating composition on a total solids basis. In one non-limiting embodiment, the amount of the at least one cationic lubricant can range from 0.1 to 15 weight percent of the coating composition on a total solids basis, such as, for example, 1 to 10, and 2 to 8 weight percent of the coating composition on a total solids basis.

In certain embodiments of the present invention, the amount of the at least one polymeric lubricant can be no greater than 15 weight percent of the coating composition on a total solids basis. In one non-limiting embodiment, the amount of the at least one polymeric lubricant can range from 0.1 to 15 weight percent of the coating composition on a total solids basis, such as, for example, 1 to 10, and 2 to 8 weight percent of the coating composition on a total solids basis.

The coating composition can also comprise at least one film forming material. In one embodiment, the at least one film forming material can comprise water-soluble polymeric materials. Non-limiting examples of useful materials include polyalkylene polyols and polyoxyalkylene polyols, such as MACOL E-300, which is commercially available from BASF Corporation of Parsippany, N.J., and CARBOWAX 300 and CARBOWAX 400, which is commercially available from Dow Chemicals. Another non-limiting example of a useful film forming material is POLYOX WSR 301 which is a poly (ethylene oxide) commercially available from Dow Chemicals.

In certain embodiments, the amount of the at least one film forming material present in the coating composition of the present invention can range from 0.1 to 10 weight percent of the aqueous sizing composition on a total solids basis. In one non-limiting embodiment, the amount of film forming material present in the sizing composition can range from 0.1 to 5 weight percent of the aqueous sizing composition on a total solids basis, such as, for example, from 0.5 to 2 weight percent of the coating composition on a total solids basis.

The coating composition can further include at least one surface modifying or coupling agents. Suitable coupling agents can be selected from functional organo silane coupling agents. Such coupling agents are believed to have dual functionality. Each metal or silicon atom has attached to it one or more hydrolyzable groups which can react with the glass surface to remove hydroxyl groups and one or more groups which, it is believed, can compatibilize or react with other components in the coating composition.

Non-limiting examples of useful functional organo-silane coupling agents include gamma-aminopropyltrialkoxysilanes, gamma-isocyanatopropyltriethoxysilane, vinyl-trialkoxysilanes, glycidoxypropyltrialkoxysilanes and ureidopropyltrialkoxysilanes. Non-limiting examples of useful functional organo-silane coupling agents include A-187 gamma-glycidoxy-propyltrimethoxysilane, A-174 gamma-methacryloxypropyltrimethoxysilane, A-1100 gamma-aminopropyltriethoxysilane silane coupling agents, A-1108 amino silane coupling agent and A-1160 gamma-ureidopropyltriethoxysilane (each of which is commercially available from Crompton Corporation of Greenwich, Conn.). Another non-limiting example of an organo-silane coupling agent includes Z-6032, an N-β(N-vinylbenzylaminoethyl)γ-aminopropyltrimethoxysilane, which is manufactured by Dow Corning of Midland, Mich. and is disclosed, for example, in U.S. Pat. No. 4,798,889.

The organo silane coupling agent can be at least partially hydrolyzed with water prior to application to the fibers, for example at a 1:1 stoichiometric ratio or, if desired, applied in unhydrolyzed form. The pH of the water can be modified by the addition of an acid or a base to initiate or speed the hydrolysis of the coupling agent as is well known in the art. Other examples of useful silane coupling agents are set forth in K. Loewenstein, *The Manufacturing Technology of Continuous Glass Fibres* at page 253 (3d Ed. New York 1983), which is hereby incorporated by reference.

The amount of the at least one organo silane coupling agent can range from 0.1 to 25 weight percent of the coating composition on a total solids basis. In one non-limiting embodiment, the amount of the at least one organo silane coupling agent ranges from 1 to 20, such as, for example, from 8 to 16 weight percent of the sizing composition on a total solids basis.

The coating composition of the present invention can additionally include at least one polymeric dispersion of particles. Non limiting examples of suitable particle dispersions include a dispersion of polyethylene particles, a dispersion of polypropylene particles, a dispersion of ethylene/propylene copolymer particles, and mixtures thereof. A non-limiting example of a dispersion of polyethylene particles is PROTOLUBE HD, which is commercially available from Bayer Corporation of Pittsburgh, Pa.

The at least one polymeric dispersion of particles, when added to the components which form the coating composition, can range from 0.1 to 15 weight percent on a total solids basis. In one non-limiting embodiment, the at least one dispersion of polymeric particles, when added to the components which form the coating composition, ranges from 0.1 to 10, such as, for example, from 0.1 to 5 weight percent on a total solids basis.

The coating compositions of the present invention can further comprise one or more organic acids in an amount sufficient to provide the coating composition with a pH ranging from 2 to 10. In one non-limiting embodiment of the present invention, the coating compositions can comprise one or more organic acids in an amount sufficient to provide the coating compositions with a pH ranging from 3 to 9, such as, for example, from 4 to 8. Non-limiting examples of organic acids suitable for use in the present invention include mono- and polycarboxylic acids and/or anhydrides thereof, such as acetic, citric, formic, propionic, caproic, lactic, benzoic, pyruvic, oxalic, maleic, fumaric, acrylic, methacrylic acids and mixtures thereof.

Water is the predominant solvent for the coating compositions of the present invention. As such, water can be present in an amount sufficient to facilitate application of a coating upon the glass fibers. The weight percentage of solids of such a coating composition can range from 0.5 to 20 weight percent. In one non-limiting embodiment of the present invention, the weight percentage of solids ranges from 1 to 10 weight percent. In another non-limiting embodiment of the present invention, the weight percentage of solids ranges from 2 to 8 weight percent.

In one embodiment, the coating composition of the present invention can be free of starch materials. As used herein in the description of the present invention, "free of starch materials" or "starch-free" means that the coating composition contains less than 5 weight percent of starch materials based upon the total weight of the sizing composition, such as, for example, less than 1 weight percent based upon the total weight of the sizing composition, and less than 0.1 weight percent based upon the total weight of the sizing composition.

The coating compositions of the present invention can further comprise, in one non-limiting embodiment, a plurality of discrete particles. As used herein, the term "discrete" means that the particles do not tend to coalesce or combine to form continuous films under conventional processing conditions, but instead substantially retain their individual distinctness, and generally retain their individual shape or form. The discrete particles of the present invention can undergo shearing, i.e., the removal of a layer or sheet of atoms in a particle, necking, i.e. a second order phase transition between at least two particles, and partial coalescence during conventional fiber processing, and still be considered to be "discrete" particles.

It will be further appreciated by those skilled in the art that fiber strands having a coating composition that contains a plurality of discrete particles can be woven into fabrics and made into electronic supports, electronic circuit boards, aperture bonding tape, and aerospace composite materials (as described below) in accordance with the present invention.

The particles can have any shape or configuration desired. Although not limiting in the present invention, examples of suitable particle shapes include spherical (such as beads, microbeads or hollow spheres), cubic, platy or acicular (elongated or fibrous). Additionally, the particles can have an internal structure that is hollow, porous or void free, or a combination thereof, e.g. a hollow center with porous or solid walls. For more information on suitable particle characteristics see H. Katz et al. (Ed.), *Handbook of Fillers and Plastics* (1987) at pages 9-10, which are specifically incorporated by reference herein.

The particles can be formed from materials selected from polymeric inorganic materials, non-polymeric inorganic materials, polymeric organic materials, non-polymeric organic materials, composite materials, and mixtures of any of the foregoing. As used herein, the term "polymeric inorganic material" means a polymeric material having a backbone repeat unit based on an element or elements other than carbon. For more information see *J. E. Mark et al.* at page 5, which is specifically incorporated by reference herein. As used herein, the term "polymeric organic materials" means synthetic polymeric materials, semisynthetic polymeric materials and natural polymeric materials having a backbone repeat unit based on carbon.

An "organic material", as used herein, means carbon containing compounds wherein the carbon is typically bonded to itself and to hydrogen, and often to other elements as well, and excludes binary compounds such as the carbon oxides, the carbides, carbon disulfide, etc.; such ternary compounds as the metallic cyanides, metallic carbonyls, phosgene, carbonyl sulfide, etc.; and carbon-containing ionic compounds such as the metallic carbonates, such as calcium carbonate and sodium carbonate. As used herein, the term "inorganic materials" means any material that is not an organic material. See R. Lewis, Sr., *Hawley's Condensed Chemical Dictionary*, (12th Ed. 1993) at pages 761-762, and M. Silberberg, Chemistry *The Molecular Nature of Matter and Change* (1996) at page 586, which are specifically incorporated by reference herein.

As used herein, the term "composite material" means a combination of two or more differing materials. The particles formed from composite materials generally have a hardness at their surface that is different from the hardness of the internal portions of the particle beneath its surface. More specifically, the surface of the particle can be modified in any manner well known in the art, including, but not limited to, chemically or physically changing its surface characteristics using techniques known in the art, such that the surface hardness of the particle is equal to or less than the hardness of the glass fibers while the hardness of the particle beneath the surface is greater than the hardness of the glass fibers. For example, a particle can be formed from a primary material that is coated, clad or encapsulated with one or more secondary materials to form a composite particle that has a softer surface. In yet another alternative embodiment, particles formed from composite materials can be formed from a primary material that is coated, clad or encapsulated with a different form of the primary material. For more information on particles useful in the present invention, see G. Wypych, *Handbook of Fillers*, 2nd Ed. (1999) at pages 15-202, which are specifically incorporated by reference herein.

Representative non-polymeric, inorganic materials useful in forming the particles of the present invention include, but are not limited to, inorganic materials selected from graphite, metals, oxides, carbides, nitrides, borides, sulfides, silicates, carbonates, sulfates and hydroxides. A non-limiting example of a suitable inorganic nitride from which the particles are formed is boron nitride. In one non-limiting embodiment of the particles, the boron nitride particles have a hexagonal crystal structure. Non-limiting examples of particles formed from boron nitride that are suitable for use in the present invention are POLARTHERM® 100 Series (PT 120, PT 140, PT 160 and PT 180); 300 Series (PT 350) and 600 Series (PT 620, PT 630, PT 640 and PT 670) boron nitride powder particles, commercially available from Advanced Ceramics Corporation of Lakewood, Ohio. "PolarTherm® Thermally Conductive Fillers for Polymeric Materials", a technical bulletin of Advanced Ceramics Corporation of Lakewood, Ohio (1996), which is specifically incorporated by reference herein.

A non-limiting example of a useful inorganic oxide is zinc oxide. Suitable inorganic sulfides include, but are not limited to, molybdenum disulfide, tantalum disulfide, tungsten disulfide and zinc sulfide. Useful inorganic silicates include, but are not limited to, aluminum silicates and magnesium silicates, such as vermiculite. Suitable metals include, but are not limited to, molybdenum, platinum, palladium, nickel, aluminum, copper, gold, iron, silver, alloys, and mixtures of any of the foregoing.

In another non-limiting embodiment of the present invention, the particles can be formed from non-polymeric, organic materials. Examples of non-polymeric, organic materials useful in the present invention include, but are not limited to, stearates (such as zinc stearate and aluminum stearate), carbon black and stearamide.

In yet another non-limiting embodiment of the present invention, the particles can be formed from inorganic polymeric materials. Non-limiting examples of useful inorganic polymeric materials include polyphosphazenes, polysilanes, polysiloxane, polygeremanes, polymeric sulfur, polymeric selenium, silicones, and mixtures of any of the foregoing. A specific non-limiting example of a particle formed from an inorganic polymeric material suitable for use in the present invention is TOSPEARL[2], which is a particle formed from cross-linked siloxanes and is commercially available from Toshiba Silicones Company, Ltd. of Japan.

[2]See R. J. Perry "Applications for Cross-Linked Siloxane Particles" *Chemtech*, February 1999 at pages 39-44.

In still another non-limiting embodiment of the present invention, the particles can be formed from synthetic, organic polymeric materials. Suitable organic polymeric materials include, but are not limited to, thermosetting materials and thermoplastic materials. Suitable thermosetting materials include, but are not limited to, thermosetting polyesters, vinyl esters, epoxy materials, phenolics, aminoplasts, thermosetting polyurethanes, and mixtures of any of the foregoing. A non-limiting example of a synthetic polymeric particle formed from an epoxy material is an epoxy microgel particle.

Suitable thermoplastic materials include, but are not limited to, thermoplastic polyesters, polycarbonates, polyolefins, acrylic polymers, polyamides, thermoplastic polyurethanes, vinyl polymers, and mixtures of any of the foregoing. Suitable thermoplastic polyesters include, but are not limited to, polyethylene terephthalate, polybutylene terephthalate and polyethylene naphthalate. Suitable polyolefins include, but are not limited to, polyethylene, polypropylene and polyisobutene. Suitable acrylic polymers include, but are not limited to, copolymers of styrene and acrylic monomer and polymers containing methacrylate. Non-limiting examples of synthetic polymeric particles formed from an acrylic copolymer are RHOPLEX® B-85[3], which is an opaque, non-crosslinking solid acrylic particle emulsion, ROPAQUE® HP-1055[4], which is an opaque, non-film-forming, styrene acrylic polymeric synthetic pigment having a 1.0 micrometer particle size, a solids content of 26.5 percent by weight and a 55 percent void volume, ROPAQUE® OP-96[5] and ROPAQUE® HP-543P[6], which are identical, each being an opaque, non-film-forming, styrene acrylic polymeric synthetic pigment dispersion having a particle size of 0.55 micrometers and a solids content of 30.5 percent by weight, and ROPAQUE® OP-62 LO[7] which is also an opaque, non-film-forming, styrene acrylic polymeric synthetic pigment dispersion having a particles size of 0.40 micrometers and a solids content of 36.5 percent by weight. Each of these particles is commercially available from Rohm and Haas Company of Philadelphia, Pa.

[3]See "Chemicals for the Textile Industry" September 1987, available from Rohm and Haas Company, Philadelphia, Pa.
[4]See product property sheet entitled: "ROPAQUE® HP-1055, Hollow Sphere Pigment for Paper and Paperboard Coatings" October 1994, available from Rohm and Haas Company, Philadelphia, Pa. at page 1, which is hereby incorporated by reference.
[5]See product technical bulletin entitled: "Architectural Coatings-ROPAQUE® OP-96, The All Purpose Pigment", April 1997 available from Rohm and Haas Company, Philadelphia, Pa. at page 1 which is hereby incorporated by reference.
[6]ROPAQUE® HP-543P and ROPAQUE® OP-96 are the same material; the material is identified as ROPAQUE® HP-543P in the paint industry and as ROPAQUE® OP-96 in the coatings industry.
[7]See product technical bulletin entitled: "Architectural Coatings-ROPAQUE® OP-96, The All Purpose Pigment", April 1997 available from Rohm and Haas Company, Philadelphia, Pa. at page 1, which is hereby incorporated by reference.

The particles according to the present invention can also be formed from semisynthetic, organic polymeric materials and natural polymeric materials. As used herein, a "semisynthetic material" is a chemically modified, naturally occurring material. Suitable semisynthetic, organic polymeric materials from which the particles can be formed include, but are not limited to, cellulosics, such as methylcellulose and cellulose acetate; and modified starches, such as starch acetate and starch hydroxyethyl ethers. Suitable natural polymeric materials from which the particles can be formed include, but are not limited to, polysaccharides, such as starch; polypeptides, such as casein; and natural hydrocarbons, such as natural rubber and gutta percha.

In one non-limiting embodiment of the present invention, the polymeric particles are formed from hydrophobic polymeric materials to reduce or limit moisture absorption by the coated strand. Non-limiting examples of such hydrophobic polymeric materials include but are not limited to polyethylene, polypropylene, polystyrene and polymethylmethacrylate. Non-limiting examples of polystyrene copolymers include ROPAQUE® HP-1055, ROPAQUE® OP-96, ROPAQUE® HP-543P, and ROPAQUE® OP-62 LO pigments (each discussed above).

In another non-limiting embodiment of the present invention, the particles can be hollow particles formed from materials selected from polymeric and non-polymeric inorganic materials, polymeric and non-polymeric organic materials, composite materials, and mixtures of any of the foregoing. Non-limiting examples of suitable materials from which the hollow particles can be formed are described above. Non-limiting examples of a hollow polymeric particle useful in present invention are ROPAQUE® HP-1055, ROPAQUE® OP-96, ROPAQUE® HP-543P, and ROPAQUE® OP-62 LO pigments (each discussed above). For other non-limiting examples of hollow particles that can be useful in the present invention see H. Katz et al. (Ed.) (1987) at pages 437-452, which are specifically incorporated by reference herein.

The particles useful in the forming size composition of present invention can be present in a dispersion, suspension or emulsion in water. Other solvents, such as mineral oil or alcohol (preferably less than 5 weight percent), can be included in the dispersion, suspension or emulsion, if desired. A non-limiting example of a dispersion of particles formed from an inorganic material is ORPAC BORON NITRIDE RELEASECOAT-CONC, which is a dispersion of 25 weight percent boron nitride particles in water and is commercially available from ZYP Coatings, Inc. of Oak Ridge, Tenn. See "ORPAC BORON NITRIDE RELEASECOAT-CONC", a technical bulletin of ZYP Coatings, Inc., which is specifically incorporated by reference herein.

Other useful products which are commercially available from ZYP Coatings include BORON NITRIDE LUBRI-COAT® paint, and BRAZE STOP and WELD RELEASE products. Specific, non-limiting examples of emulsions and dispersions of synthetic polymeric particles formed from acrylic polymers and copolymers include: RHOPLEX® B-85 acrylic emulsion (discussed above), RHOPLEX® GL-623[8] which is an all acrylic firm polymer emulsion having a solids content of 45 percent by weight and a glass transition temperature of 98° C.; EMULSION E-2321[9] which is a hard, methacrylate polymer emulsion having a solids content of 45 percent by weight and a glass transition temperature of 105° C.; ROPAQUE® OP-96 and ROPAQUE® HP-543P (discussed above), which are supplied as a dispersion having a particle size of 0.55 micrometers and a solids content of 30.5 percent by weight; ROPAQUE® OP-62 LO (discussed above), which is supplied as a dispersion having a particles size of 0.40 micrometers and a solids content of 36.5 percent by weight; and ROPAQUE® HP-1055 (discussed above), which is supplied as a dispersion having a solids content of 26.5 percent by weight; all of which are commercially available from Rohm and Haas Company of Philadelphia, Pa.

[8]See product property sheet entitled: "Rhoplex® GL-623, Self-Crosslinking Acrylic Binder of Industrial Nonwovens", March 1997 available from Rohm and Haas Company, Philadelphia, Pa., which is hereby incorporated by reference.
[9]See product property sheet entitled: "Building Products Industrial Coatings-Emulsion E-2321", 1990, available from Rohm and Haas Company, Philadelphia, Pa., which is hereby incorporated by reference.

In certain non-limiting embodiments of the present invention the average size of the particles incorporated into a coating composition applied to fibers to be processed on air-jet looms can be selected to provide sufficient spacing between at least two adjacent fibers to permit air-jet transport of the fiber strand across the loom. As used herein, "air-jet loom" means a type of loom in which the fill yarn (weft) is inserted into the warp shed by a blast of compressed air from one or more air jet nozzles in a manner well known to those skilled in the art.

In another non-limiting embodiment, the average size of the particles incorporated into a forming size composition applied to fibers to be impregnated with a polymeric matrix material is selected to provide sufficient spacing between at least two adjacent fibers to permit good wet-out and wet-through of the fiber strand. As used herein, the term "wet-out" means the ability of a material, for example a slashing solution or a polymeric matrix material, to penetrate through the individual bundles or strands of fibers, and the term "wet-through" means the ability of a material, for example a polymeric matrix material, to penetrate through the fabric.

Although not limiting in the present invention, in one embodiment the particles have an average size, measured using laser scattering techniques, of no greater than 1000 micrometers. In another non-limiting embodiment, the particles have an average size, measured using laser scattering techniques, ranging from 0.001 to 100 micrometers. In another non-limiting embodiment, the particles have an average size, measured using laser scattering techniques, ranging from 0.1 to 25 micrometers.

In another non-limiting embodiment of the present invention, the average particle size, measured using laser scattering techniques, is at least 0.1 micrometers and in one non-limiting embodiment ranges from 0.1 micrometers to 10 micrometers and in another non-limiting embodiment ranges from 0.1 micrometers to 5 micrometers. In another non-limiting embodiment, the average particle size of the particles, measured using laser scattering techniques, is at least 0.5 micrometers and ranges from 0.5 micrometers to 2 micrometers. In another non-limiting embodiment of the present invention, the particles have an average particle size that is generally smaller than the average diameter of the fibers which the sizing composition is applied. It has been observed that twisted yarns made from fiber strands having a layer of a residue of a forming size composition comprising particles having average particles sizes discussed above can advantageously provide sufficient spacing between adjacent fibers to permit air-jet weavability (i.e., air-jet transport across the loom) while maintaining the integrity of the fiber strand and providing acceptable wet-through and wet-out characteristics when impregnated with a polymeric matrix material.

In another non-limiting embodiment of the present invention, the average particles size, measured using laser scattering techniques, is at least 3 micrometers and ranges from 3 to 1000 micrometers. In another non-limiting embodiment, the average particle size, measured using laser scattering techniques, is at least 5 micrometers and ranges from 5 to 1000 micrometers. In still another non-limiting embodiment, the particle size ranges from 10 to 25 micrometers, measured using laser scattering techniques. In another non-limiting embodiment, the average particle size corresponds generally to the average nominal diameter of the glass fibers. It has been observed that fabrics made with strands coated with particles falling within the sizes discussed above exhibit good wet-through and wet-out characteristics when impregnated with a polymeric matrix material.

It will be recognized by one skilled in the art that mixtures of one or more particles having different average particle sizes can be incorporated into the sizing composition in accordance with the present invention to impart the desired properties and processing characteristics to the fiber strands and to the products subsequently made therefrom. More specifically, different sized particles can be combined in appropriate amounts to provide strands having, for example, good air-jet transport properties as well to provide a fabric exhibiting, for example, good wet-out and wet-through characteristics.

The coating composition of the present invention can be prepared by any suitable method well known to those of ordinary skill in the art.

Coating compositions according to the present invention can be applied in many ways, for example by contacting the filaments with a roller or belt applicator, spraying or other means. The coated fibers can be dried at room temperature or at elevated temperatures. The dryer removes excess moisture from the fibers and, if present, cures any curable sizing composition components. The temperature and time for drying the glass fibers will depend upon such variables as the percentage of solids in the coating composition, components of the coating composition and type of fiber.

As used herein, the term "cure" as used in connection with a composition, e.g., "a cured composition," shall mean that any crosslinkable components of the composition are at least partially crosslinked. In certain embodiments of the present invention, the crosslink density of the crosslinkable components, i.e., the degree of crosslinking, ranges from 5% to 100% of complete crosslinking. In other embodiments, the crosslink density ranges from 35% to 85% of full crosslinking. In other embodiments, the crosslink density ranges from 50% to 85% of full crosslinking. One skilled in the art will understand that the presence and degree of crosslinking, i.e., the crosslink density, can be determined by a variety of methods, such as dynamic mechanical thermal analysis (DMTA) using a Polymer Laboratories MK III DMTA analyzer conducted under nitrogen. This method determines the glass transition temperature and crosslink density of free films of coatings or polymers. These physical properties of a cured material are related to the structure of the crosslinked network.

According to this method, the length, width, and thickness of a sample to be analyzed are first measured, the sample is tightly mounted to the Polymer Laboratories MK III apparatus, and the dimensional measurements are entered into the apparatus. A thermal scan is run at a heating rate of 3° C./min, a frequency of 1 Hz, a strain of 120%, and a static force of 0.01N, and sample measurements occur every two seconds. The mode of deformation, glass transition temperature, and crosslink density of the sample can be determined according to this method. Higher crosslink density valves indicate a higher degree of crosslinking in the coating.

In certain embodiments, the amount of the coating composition present on the fiber strand can be less than 30 percent by weight as measured by loss on ignition (LOI). In one non-limiting embodiment, the amount of the coating composition present on the fiber strand can be less than 10 percent by weight, such as, for example, between 0.1 to 5 percent by weight. The coating composition on the fiber strand can be a residue of an aqueous coating composition or a powdered coating composition. In one embodiment of the invention, the LOI is less than 1 percent by weight. As used herein, the term "loss on ignition" means the weight percent of dried coating composition present on the surface of the fiber strand as determined by the following formula (I):

$$LOI = 100 \times [(W_{dry} - W_{bare})/W_{dry}] \quad (I)$$

wherein $W_{dry}$ is the weight of the fiber strand plus the weight of the coating composition after drying in an oven at 220° F. (about 104° C.) for 60 minutes and $W_{bare}$ is the weight of the bare fiber strand after heating the fiber strand in an oven at 1150° F. (about 621° C.) for 20 minutes and cooling to room temperature in a dessicator.

In certain embodiments, a primary size, i.e., the initial size applied after fiber formation, is applied to the fiber. After the application of a primary size, the fibers are gathered into strands having 2 to 15,000 fibers per strand, such as, for example, from 100 to 1600 fibers per strand.

A secondary coating composition can be applied to the primary size in an amount effective to coat or impregnate the portion of the strands, for example by dipping the coated strand in a bath containing the secondary coating composition, spraying the secondary coating composition upon the coated strand or by contacting the coated strand with an applicator as discussed above. The coated strand can be passed through a die to remove excess coating composition from the strand and/or dried as discussed above for a time sufficient to at least partially dry or cure the secondary coating composition. The method and apparatus for applying the secondary coating composition to the strand is determined in part by the configuration of the strand material. The strand can be dried after application of the secondary coating composition in a manner well known in the art.

Suitable secondary coating compositions can include one or more film-forming materials, lubricants and other additives such as are discussed above. The secondary coating can be different from the primary sizing composition, i.e., it (1) contains at least one component which is chemically different from the components of the sizing composition; or (2) contains at least one component in an amount which is different from the amount of the same component contained in the sizing composition.

The glass fiber strands can be further processed by twisting into a yarn, chopping, combination in parallel to form a bundle or roving, weaving into a cloth or forming into a chopped or continuous strand mat, as discussed above. The glass fiber strands can be twisted by any conventional twisting technique known to those skilled in the art, for example by using twist frames. Generally, twist is imparted to the strand by feeding the strand to a bobbin rotating at a speed which would enable the strand to be wound onto the bobbin at a faster rate than the rate at which the strand is supplied to the bobbin. Generally, the strand is threaded through an eye located on a ring which traverses the length of the bobbin to impart twist to the strand, typically about 0.5 to about 3 turns per inch.

Twisted strands and non-twisted strands (sometimes referred to as zero twist strands) can be used to prepare woven or non-woven fabrics, knitted or braided products, or reinforcements. The coated fiber strands can be used in the warp and/or fill direction of the fabrics. A suitable woven reinforcing fabric can be formed by using any conventional loom well known to those skilled in the art, such as a shuttle loom or rapier loom, but preferably is formed using an air jet loom. Air jet looms are commercially available, for example, from Tsudakoma of Japan as Model No. 103 and Sulzer Brothers Ltd. of Zurich, Switzerland as Model Nos. L-5000 or L-5100. See Sulzer Ruti L5000 and L5100 Product Bulletins of Sulzer Ruti Ltd., Switzerland, which are hereby incorporated by reference. As used herein, "air jet weaving" means a type of fabric weaving using an air jet loom in which fill yarn (weft) is inserted into a warp shed formed by the warp yarn by a blast of compressed air from one or more air jet nozzles, in a manner well known to those skilled in the art. The fill yarn is propelled across the width of the fabric, typically 10 to 60 inches (0.254 to 1.524 meters), by the compressed air.

The compatibility and aerodynamic properties of different yarns with the air jet weaving process can be determined by the following method, which will generally be referred to herein as the "Air Jet Transport Drag Force" Test Method. The Air Jet Transport Drag Force Test is used to measure the attractive or pulling force ("drag force") exerted upon the yarn as the yarn is pulled into the air jet nozzle by the force of the air jet. In this method, each yarn sample is fed at a rate of about 274 meters (about 300 yards) per minute through a Sulzer Ruti needle air jet nozzle unit Model No. 044 455 001 which has an internal air jet chamber having a diameter of 2 millimeters and a nozzle exit tube having a length of 20 centimeters (commercially available from Sulzer Ruti of Spartanburg, N.C.) at a desired air pressure, typically between about 172 to about 379 kiloPascals (about 25 to about 55 pounds per square inch) gauge. A tensiometer is positioned in contact with the yarn at a position prior to the yarn entering the air jet nozzle. The tensiometer provides a measurement of the tension exerted upon the yarn by the air jet as the yarn is pulled into the air jet nozzle.

The hydrolytic resistance of a fabric may be utilized to evaluate the adsorption of moisture to samples of yarn. It can be measured with solder dip tests for laminates. Such dip tests can be carried out by initially creating prepregs and then forming them into laminates ranging from 1 to 8 ply. The laminates are subsequently dipped in molted solder ranging from 500° F. to 560° F. for periods ranging from 10 seconds to 3 minutes. Upon extraction from the solder, the laminates are examined for the formation of blisters or measles, also known as delamination, caused by the escape of moisture trapped within the laminate. Measles show up as tiny fractures on the laminate upon microscopic examination and are typically one sixty-thousandth of an inch in diameter.

Microwarping may be utilized to analyze the breakage of the strands. This analysis is well known in the art and simulates a normal warping operation with modifications to quantify fuzz accumulation and to count fuzz balls.

The coated fiber strands can be used in a wide variety of applications, such as a fabric, laminates, printed circuit boards, armature banding tape, aviation composite materials and aerospace composite materials. In these various applications, the matrix materials useful in the present invention include thermosetting materials such as thermosetting polyesters, vinyl esters, epoxides (containing at least one epoxy or oxirane group in the molecule, such as polyglycidyl ethers of polyhydric alcohols or thiols), phenolics, aminoplasts, thermosetting polyurethanes, derivatives of any of the foregoing, and mixtures of any of the foregoing. Suitable matrix materials for forming laminates for printed circuit boards include FR-4 epoxy resins, which are polyfunctional epoxy resins such as difunctional brominated epoxy resins, polyimides and liquid crystalline polymers, the compositions of which are well know to those skilled in the art. If further information regarding such compositions is needed, see *Electronic Materials Handbook*™, ASM International (1989) at pages 534-537, which is specifically incorporated by reference herein.

Non-limiting examples of suitable polymeric thermoplastic matrix materials include polyolefins, polyamides, thermoplastic polyurethanes and thermoplastic polyesters, vinyl polymers, and mixtures of any of the foregoing. Further examples of useful thermoplastic materials include polyimides, polyether sulfones, polyphenyl sulfones, polyetherketones, polyphenylene oxides, polyphenylene sulfides, polyacetals, polyvinyl chlorides and polycarbonates.

A exemplary matrix material formulation consists of EPON 1120-A80 epoxy resin (commercially available from Shell Chemical Company of Houston, Tex.), dicyandiamide, 2-methylimidazole and DOWANOL PM glycol ether (commercially available from The Dow Chemical Co. of Midland, Mich.).

Other components which can be included with the polymeric matrix material and reinforcing material in the composites according to the present invention include colorants or pigments, lubricants or processing aids, ultraviolet light (UV) stabilizers, antioxidants, other fillers and extenders.

The present invention will now be illustrated by the following specific, non-limiting examples.

EXAMPLES

Each of the components in the amounts (weight percent of total solids) set forth in Table 1 were mixed to form aqueous sizing compositions useful in the present invention.

TABLE 1

| | Wt. Percent Component on Total Solids Basis Sample | | | | | | | |
|---|---|---|---|---|---|---|---|---|
| Component | 1 | 2 | 3 | 4 | 5 | 6 | 7 | 8 |
| POLYOX WSR 301[10] | 1.1 | 1.1 | 1.5 | 1 | 1 | 1 | 1 | 1 |
| DYNAKOLL SI 100[11] | 93.4 | 87.6 | 81.5 | 83 | 87 | 83 | 79.2 | 78.8 |
| ALUBRASPIN 227[12] | 1.1 | 6.8 | 6 | 6 | 2 | 6 | 6 | 5.7 |
| Z-6032[13] | 4.4 | 4.5 | 11 | 10 | 10 | 10 | 9.9 | 9.5 |
| PROTOLUBE HD-A[14] | — | — | — | — | — | — | 4 | 5 |
| acetic acid | <0.1 | <0.1 | <0.1 | <0.1 | <0.1 | <0.1 | <0.1 | <0.1 |
| Est. % solids in sizing | 7.45 | 7.05 | 8 | 4.02 | 10.01 | 5.53 | 5.77 | 6.5 |

[10]POLYOX WSR 301 water-soluble poly(ethylene oxide) lubricant which is commercially available from Union Carbide Corporation.
[11]DYNAKOLL SI 100 chemically modified rosin which is was purchased from Eka Chemicals AB, Sweeden.
[12]ALUBRASPIN 227 silylated polyamine polymer lubricant which was purchased from BASF Corp. of Parsippany, New Jersey.
[13]Z-6032 N-β(N-vinylbenzylaminoethyl)γ-aminopropyltrimethoxysilane which is commercially available from Dow Corning of Midland Michigan.
[14]PROTOLUBE HD-A dispersion of polyethylene particles which is commercially available from Bayer Corporation of Pittsburgh, PA.

Samples 1-6 were prepared as follows:
1. POLYOX WSR 301 was added to water ranging from 150 deg. F. to 160 deg. F. under stirred conditions and then transferred to a main mix tank for subsequent processing.
2. DYNAKOLL SI 100 was added to a separate vessel with an Eppenbach high shear mixture. With the Eppenbach running, water ranging from 150 deg. F. to 160 deg. F. was slowly added to the vessel containing the DYNAKOLL SI 100. The mixture was then Eppenbached for 5 minutes. The solution was then transferred to the main mix tank for subsequent processing.
3. ALUBRASPIN 227 was added to water ranging from 150 deg. F. to 160 deg. F. in a separate vessel under stirred conditions. Acetic acid was added to the solution to adjust the pH pH of the solution to 5.0±0.5. The solution was then transferred to the main mix tank for subsequent processing.
4. Room temperature water was then weighted into a separate vessel with a stirrer.
5. Acetic acid was added to the water with the stirrer running.
6. Z-6032 was added to the acetic acid/water solution with the stirrer running; the solution was stirred for 1 hour; the solution stirred for 1 hour was then added very slowly to water in a separate vessel to dilute the Z-6032/acetic acid solution; the diluted Z-6032/acetic acid mixture was then added to the main mix tank.
7. Acetic acid was added to the main mix tank to adjust the pH of the final mix to 4.0.
8. Water was then added, as required, to dilute to the required volume.

Sample 7 was prepared as/follows:
1. POLYOX WSR 301 was added to water ranging from 150 deg. F. to 160 deg. F. under stirred conditions and then transferred to a main mix tank for subsequent processing.
2. DYNAKOLL SI 100 was added to a separate vessel with an Eppenbach high shear mixture. With the Eppenbach running, water ranging from 150 deg. F. to 160 deg. F. was slowly added to the vessel containing the DYNAKOLL SI 100. The mixture was then Eppenbached for 5 minutes. The solution was then transferred to the main mix tank for subsequent processing.
3. ALUBRASPIN 227 was added to water ranging from 150 deg. F. to 160 deg. F. in a separate vessel under stirred conditions. Acetic acid was added to the solution to adjust the pH of the solution to 5.0±0.5. The solution was then transferred to the main mix tank for subsequent processing.
4. Room temperature water was then weighted into a separate vessel with a stirrer.
5. Acetic acid was added to the water with the stirrer running.
6. Z-6032 was added to the acetic acid/water solution with the stirrer running; the solution was stirred for 1 hour; the solution stirred for 1 hour was then added very slowly to water in a separate vessel to dilute the Z-6032/acetic acid solution; the diluted Z-6032/acetic acid mixture was then added to the main mix tank.
7. PROTOLUBE HDA was then added to the main mix tank.
8. Acetic acid was added to the main mix tank to adjust the pH of the final mix to 4.0.
9. Water was then added, as required, to dilute to the required volume.

Samples 6 and 7 were applied to glass fiber strands which were subsequently twisted without oven drying as 2 doffs with 1.0 turns/inch and standard milk bottle bobbin build.

Test 1

The yarns of samples 6 and 7 were evaluated for Friction Force by pulling each yarn Sample at a rate of 262 meters (287 yards) per minute through a pair of conventional electronic tensiometers and around a stationary stainless steel cylinder with a 4.445 centimeters (1.75 inches) diameter aligned between the tensiometers such that the yarn Samples made one complete wrap around the cylinder. The difference in tension between the tensiometers (in grams) as set forth in Table 2 below is a measure of the friction against the metal surface and is intended to be similar to the frictional forces to which the yarn may be subjected during weaving operations.

The average loss on ignition (weight percent of solids of the forming size composition divided by the total weight of the glass and dried forming size composition) of each trial of each Sample is set forth in Table 2 as well.

TABLE 2

| Sample | Bobbin Wt. (lbs.) | Tension (grams) | LOI |
|---|---|---|---|
| 6 | 10.1 | 166.83 | 0.47 |
| | 10.3 | 151.45 | 0.47 |
| | 5.1 | High | 0.43 |
| | 5.2 | High | 0.49 |
| 7 | 10.0 | 123.96 | 0.55 |
| | 10.3 | 115.91 | 0.51 |
| | 5.0 | 168.30 | 0.52 |
| | 5.1 | 142.04 | 0.52 |

Test 2

The compatibility of the sample yarns with the air jet weaving process were determined using the "Air Jet Transport Drag Force" Test Method discussed in detail above.

Each yarn sample was fed at a rate of 274 meters (300 yards) per minute through a Sulzer Ruti needle air jet nozzle unit Model No. 044 455 001 which had an internal air jet chamber having a diameter of 2 millimeters and a nozzle exit tube having a length of 20 centimeters (commercially available from Sulzer Ruti of Spartanburg, N.C.) at an air pressure varying from 25 to 55 pounds per square inch (172 to 379 310 kiloPascals) gauge. A tensiometer was positioned in contact with the yarn at a position prior to the yarn entering the air jet nozzle. The tensiometer provided measurements of the tension (in grams) exerted upon each yarn sample by the air jet as the respective yarn sample was pulled into the air jet nozzle. These values are set forth in Table 3 below.

TABLE 3

| | | Samples | |
| --- | --- | --- | --- |
| | | 6 | 7 |
| Air Pressure | Bobbin wt. (lbs) | Tension (grams) | |
| 25 psi | 10.1 | 8.46 | 5.16 |
| | 10.3 | 8.43 | 6.86 |
| 30 psi | 10.1 | 9.85 | 6.71 |
| | 10.3 | 9.97 | 8.27 |
| 35 psi | 10.1 | 19.9 | 14.26 |
| | 10.3 | 18.09 | 17.12 |
| 40 psi | 10.1 | 24.14 | 17.26 |
| | 10.3 | 23.68 | 20.89 |
| 45 psi | 10.1 | 51.16 | 28.24 |
| | 10.3 | 56.45 | 31.47 |
| 50 psi | 10.1 | 68.47 | 48.93 |
| | 10.3 | 74.4 | 50.89 |
| 55 psi | 10.1 | 78.09 | 59.85 |
| | 10.3 | 80.12 | 64.43 |

It will be appreciated by those skilled in the art that changes could be made to the embodiments described above without departing from the broad inventive concept thereof. It is understood, therefore, that this invention is not limited to the particular embodiments disclosed, but it is intended to cover modifications which are within the spirit and scope of the invention, as defined by the appended claims.

Therefore, we claim:

1. A fiber strand comprising at least one fiber at least partially coated with a resin compatible composition formed from
    a) at least one rosin present in the composition in an amount ranging from 45 to 99 weight percent on a total solids basis,
    b) at least one cationic lubricant,
    c) at least one film forming material,
    d) at least one organosilane coupling agent, and
    e) at least one dispersion of polymeric particles.

2. The fiber strand according to claim 1, wherein the composition is a residue of an aqueous coating composition.

3. The fiber strand according to claim 1, wherein the at least one rosin is present in the composition in an amount ranging from 60 to 90 weight percent on a total solids basis.

4. The fiber strand according to claim 3, wherein the at least one rosin is present in the composition in an amount ranging from 70 to 85 weight percent on a total solids basis.

5. The fiber strand according to claim 1, wherein the at least one rosin is selected from chemically modified rosins.

6. The fiber strand according to claim 5, wherein the at least one rosin comprises at least one glycidyl ether group and at least one polyethylene glycol group.

7. The fiber strand according to claim 1, wherein the at least one cationic lubricant is present in the composition in an amount ranging from 0.1 to 15 weight percent on a total solids basis.

8. The fiber strand according to claim 7, wherein the at least one cationic lubricant is present in the composition in an amount ranging from 1 to 10 weight percent on a total solids basis.

9. The fiber strand according to claim 8, wherein the at least one cationic lubricant is present in the composition in an amount ranging from 2 to 8 weight percent on a total solids basis.

10. The fiber strand according to claim 7, wherein the at least one cationic lubricant is selected from polyamine polymers.

11. The fiber strand according to claim 10, wherein the at least one cationic lubricant comprises at least one silylated polyamine polymer.

12. The fiber strand according to claim 1, wherein the at least film forming material is present in the composition in an amount ranging from 0.1 to 10 weight percent on a total solids basis.

13. The fiber strand according to claim 12, wherein the at least one film forming material is present in the composition in an amount ranging from 0.1 to 5 weight percent on a total solids basis.

14. The fiber strand according to claim 13, wherein the at least one film forming material is present in the composition in an amount ranging from 0.5 to 2 weight percent on a total solids basis.

15. The fiber strand according to claim 12, wherein the at least one film forming material is selected from polyalkylene polyols and polyoxyalkylene polyols.

16. The fiber strand according to claim 15, wherein the at least one film forming material comprises at least one polyethylene oxide.

17. The fiber strand according to claim 1, wherein the at least one organosilane coupling agent is present in the composition in an amount ranging from 0.1 to 25 weight percent on a total solids basis.

18. The fiber strand according to claim 17, wherein the at least one organosilane coupling agent is present in the composition in an amount ranging from 1 to 20 weight percent on a total solids basis.

19. The fiber strand according to claim 18, wherein the at least one organosilane coupling agent is present in the composition in an amount ranging from 8 to 16 weight percent on a total solids basis.

20. The fiber strand according to claim 17, wherein the at least one organosilane coupling agent is selected from trialkoxysilanes.

21. The fiber strand according to claim 20, wherein the at least one organosilane coupling agent is selected from aminopropyltrialkoxysilanes.

22. The fiber strand according to claim 21, wherein the at least one organosilane coupling agent comprises
    N-β-(N-vinylbenzylaminoethyl)-γ-aminopropyltrimethoxysilane and salts thereof.

23. The fiber strand according to claim 1, wherein the at least one dispersion of polymeric particles, when added to the components which form the coating composition, is present in an amount ranging from 0.1 to 15 weight percent on a total solids basis.

24. The fiber strand according to claim 23, wherein the at least one dispersion of polymeric particles, when added to the components which form the coating composition, is present in an amount ranging from 0.1 to 10 weight percent on a total solids basis.

25. The fiber strand according to claim 24, wherein the at least one dispersion of polymeric particles, when added to the components which form the coating composition, is present in an amount ranging from 0.1 to 5 weight percent on a total solids basis.

26. The fiber strand according to claim 23, wherein the at least one dispersion of polymeric particles is selected from a dispersion of polyethylene particles, a dispersion of polypropylene particles, and a dispersion of ethylene/propylene copolymer particles.

27. The fiber strand according to claim 26, wherein the at least one dispersion of polymeric particles comprises a dispersion of polyethylene particles.

28. The fiber strand according to claim 1, wherein the at least one fiber comprises at least one inorganic fiber comprising a glass material selected from E-glass, D-glass, G-glass, S-glass, Q-glass, E-glass derivatives and combinations thereof.

29. The fiber strand according to claim 1, wherein the at least one fiber comprises at least one non-heat cleaned fiber.

30. The fiber strand according to claim 1, wherein the composition further comprises a plurality of discrete particles.

31. The fiber strand according to claim 30, wherein the plurality of discrete particles is selected from thermosetting materials, thermoplastic materials, and mixtures thereof.

32. A yarn comprising at least one fiber strand according to claim 1.

33. A fabric comprising at least one fiber strand according to claim 1.

34. A laminate comprising at least one fiber strand according to claim 1.

35. A prepreg comprising at least one fiber strand according to claim 1.

36. An electronic circuit board comprising at least one fiber strand according to claim 1.

37. An armature banding tape comprising at least one fiber strand according to claim 1.

38. An aerospace composite comprising at least one fiber strand according to claim 1.

39. An aviation composite comprising at least one fiber strand according to claim 1.

40. A fiber strand comprising at least one fiber at least partially coated with a resin compatible composition formed from
   a) at least one rosin present in the composition in an amount ranging from 45 to 99 weight percent on a total solids basis,
   b) at least one polymeric lubricant,
   c) at least one film forming material,
   d) at least one organosilane coupling agent, and
   e) at least one dispersion of polymeric particles.

41. The fiber strand according to claim 40, wherein the at least one polymeric lubricant is present in the composition in an amount ranging from 0.1 to 15 weight percent on a total solids basis.

42. The fiber strand according to claim 41, wherein the at least one polymeric lubricant is present in the composition in an amount ranging from 1 to 10 weight percent on a total solids basis.

43. The fiber strand according to claim 42, wherein the at least one polymeric lubricant is present in the composition in an amount ranging from 2 to 8 weight percent on a total solids basis.

44. The fiber strand according to claim 41, wherein the at least one polymeric lubricant is selected from polyamine polymers.

45. The fiber strand according to claim 44, wherein the at least one polymeric lubricant comprises a silylated polyamine polymer.

46. A fiber strand comprising at least one fiber at least partially coated with a starch-free composition comprising
   a) at least one rosin present in the composition in an amount ranging from 45 to 99 weight percent on a total solids basis,
   b) at least one cationic lubricant,
   c) at least one film forming material, and
   d) at least one organosilane coupling agent.

47. A fiber strand comprising at least one fiber at least partially coated with a starch-free composition comprising
   a) at least one rosin present in the composition in an amount ranging from 45 to 99 weight percent on a total solids basis,
   b) at least one polymeric lubricant,
   c) at least one film forming material, and
   d) at least one organosilane coupling agent.

48. A fiber strand comprising at least one fiber at least partially coated with a resin compatible composition comprising
   a) at least one rosin present in the composition in an amount ranging from 45 to 99 weight percent on a total solids basis,
   b) at least one silyated polyamine,
   c) at least one film forming material,
   d) at least one organosilane coupling agent.

49. An armature banding tape comprising at least one fiber strand comprising at least one fiber at least partially coated with a resin compatible composition formed from
   a) at least one rosin,
   b) at least one cationic lubricant,
   c) at least one film forming material,
   d) at least one organosilane coupling agent, and
   e) at least one dispersion of polymeric particles.

* * * * *

UNITED STATES PATENT AND TRADEMARK OFFICE
CERTIFICATE OF CORRECTION

| | | |
|---|---|---|
| PATENT NO. | : 8,062,746 B2 | Page 1 of 1 |
| APPLICATION NO. | : 10/383523 | |
| DATED | : November 22, 2011 | |
| INVENTOR(S) | : Lawton et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 533 days.

Signed and Sealed this
Twenty-second Day of May, 2012

David J. Kappos
*Director of the United States Patent and Trademark Office*